(12) United States Patent
Kerber et al.

(10) Patent No.: US 9,048,019 B2
(45) Date of Patent: *Jun. 2, 2015

(54) SEMICONDUCTOR STRUCTURE INCLUDING GUARD RING

(71) Applicant: Infineon Technologies AG, Neubiberg (DE)

(72) Inventors: Martin Kerber, Pettneu am Arlberg (AT); Matthias Stecher, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/625,889

(22) Filed: Sep. 25, 2012

(65) Prior Publication Data

US 2013/0075861 A1 Mar. 28, 2013

Related U.S. Application Data

(63) Continuation-in-part of application No. 13/245,891, filed on Sep. 27, 2011.

(51) Int. Cl.
| | |
|---|---|
| *H01L 21/02* | (2006.01) |
| *H01F 27/28* | (2006.01) |
| *H01L 23/522* | (2006.01) |
| *H01L 23/58* | (2006.01) |
| *H01L 23/00* | (2006.01) |

(52) U.S. Cl.
CPC ........ *H01F 27/2804* (2013.01); *H01L 23/5227* (2013.01); *H01L 23/585* (2013.01); *H01L 24/05* (2013.01); *H01L 2224/48463* (2013.01); *H01L 2924/3025* (2013.01)

(58) Field of Classification Search
USPC .......................... 257/401, 531, 544, 532, 758
See application file for complete search history.

(56) References Cited

U.S. PATENT DOCUMENTS

| | | | |
|---|---|---|---|
| 5,838,050 A | 11/1998 | Ker et al. | |
| 6,642,540 B2 | 11/2003 | Komurasaki et al. | |
| 7,038,292 B2 * | 5/2006 | Hsu ............................... | 257/510 |
| 7,663,207 B2 | 2/2010 | Kikuta et al. | |
| 7,728,418 B2 | 6/2010 | Nomura et al. | |
| 8,421,236 B2 | 4/2013 | Ota et al. | |
| 2004/0114287 A1 | 6/2004 | Salling et al. | |
| 2004/0150070 A1 | 8/2004 | Okada et al. | |
| 2004/0195582 A1 | 10/2004 | Tomita et al. | |
| 2005/0082618 A1 * | 4/2005 | Wu et al. ........................ | 257/355 |
| 2009/0146252 A1 * | 6/2009 | Huang et al. .................. | 257/531 |

(Continued)

FOREIGN PATENT DOCUMENTS

| | | |
|---|---|---|
| JP | H11-145401 A | 5/1999 |
| JP | H11-168100 A | 6/1999 |

(Continued)

OTHER PUBLICATIONS

Japanese Office Action for Application No. 2012-213890; Jan. 21, 2014 (with translation); 7 pages.

(Continued)

*Primary Examiner* — Jose R Diaz

(57) ABSTRACT

One or more embodiments relate to a semiconductor structure, comprising: a conductive feature; an outer guard ring; and an inner guard ring between the outer guard ring and the conductive feature, the inner guard ring being electrically coupled to the conductive feature.

36 Claims, 11 Drawing Sheets

(56) References Cited

U.S. PATENT DOCUMENTS

| | | |
|---|---|---|
| 2010/0295648 A1 | 11/2010 | Huang et al. |
| 2011/0095392 A1* | 4/2011 | Wahl et al. .................... 257/503 |
| 2012/0074515 A1 | 3/2012 | Chen et al. |
| 2012/0139060 A1* | 6/2012 | Jeon et al. .................... 257/409 |
| 2012/0212251 A1* | 8/2012 | Yanagishima et al. ... 324/762.01 |

FOREIGN PATENT DOCUMENTS

| | | |
|---|---|---|
| JP | 2003068862 A | 3/2003 |
| JP | 2003224189 A | 8/2003 |
| JP | 2004221317 A | 8/2004 |
| JP | 2005142553 A | 6/2005 |
| JP | 2006303220 A | 11/2006 |
| JP | 2006303545 A | 11/2006 |
| JP | 2007059676 A | 3/2007 |
| JP | 2008027934 A | 2/2008 |
| JP | 2008226957 A | 9/2008 |
| JP | 2011035309 A | 2/2011 |
| JP | 2011146563 A | 7/2011 |
| JP | 2013038130 A | 2/2013 |
| WO | 2007074530 A1 | 7/2007 |
| WO | 2011055611 A1 | 5/2011 |
| WO | WO 2011055611 A1 * | 5/2011 |

OTHER PUBLICATIONS

US Office Action for U.S. Appl. No. 13/245,891; Nov. 15, 2012; 9 pages.

US Office Action for U.S. Appl. No. 13/245,891; May 29, 2013; 9 pages.

Office Action issued in the corresponding German application DE 102012109164.1 dated Mar. 12, 2014, 6 pages.

Office Action received for Japanese application JP2012213890 dated Aug. 19, 2014 (2 pages) and translation (2 pages).

* cited by examiner

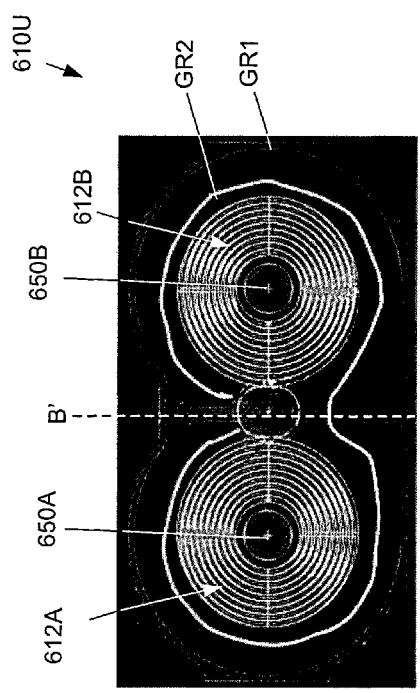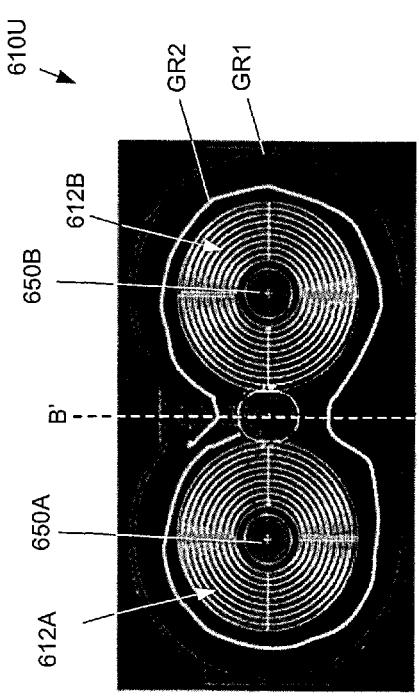

SEMICONDUCTOR STRUCTURE INCLUDING GUARD RING

CROSS-REFERENCE TO RELATED APPLICATIONS

The present application is a continuation-in-part application of U.S. application Ser. No. 13/245,891 filed Sep. 27, 2011, now pending, the entirety of which is herein incorporated by reference.

FIELD OF THE INVENTION

One or more embodiments of the present invention relate to semiconductor structures.

BACKGROUND

Coreless transformers, which may be composed of a bottom coil and a top coil, provide an attractive option for conventional CMOS process flow to fabricate products with bi-directional signal flow as used for controlling power switches at high voltage (for example, greater than 200 volts) in DC-DC converters and control of electric drives. The dielectric isolation strength to sustain the high operating voltage and robustness against very high voltage surges in particular, may be one of the limiting reliability problems. Frequently the high voltage robustness of such products may be much lower than expected from bulk material properties and the isolation distances defined by the thickness of the isolating layers and the layout and the product. After a dielectric breakdown a low ohmic conductive path may be formed between the top coil (which may be a point of high potential) and the guard ring (which may be at ground potential). Since high voltage isolation properties (for example, greater than 6,000 volts) are difficult to study experimentally, little is known about processing and environmental conditions affecting the dielectric isolation strength.

BRIEF DESCRIPTION OF THE DRAWINGS

FIGS. 9A, 9B and 9C show a semiconductor structure in accordance with an embodiment.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
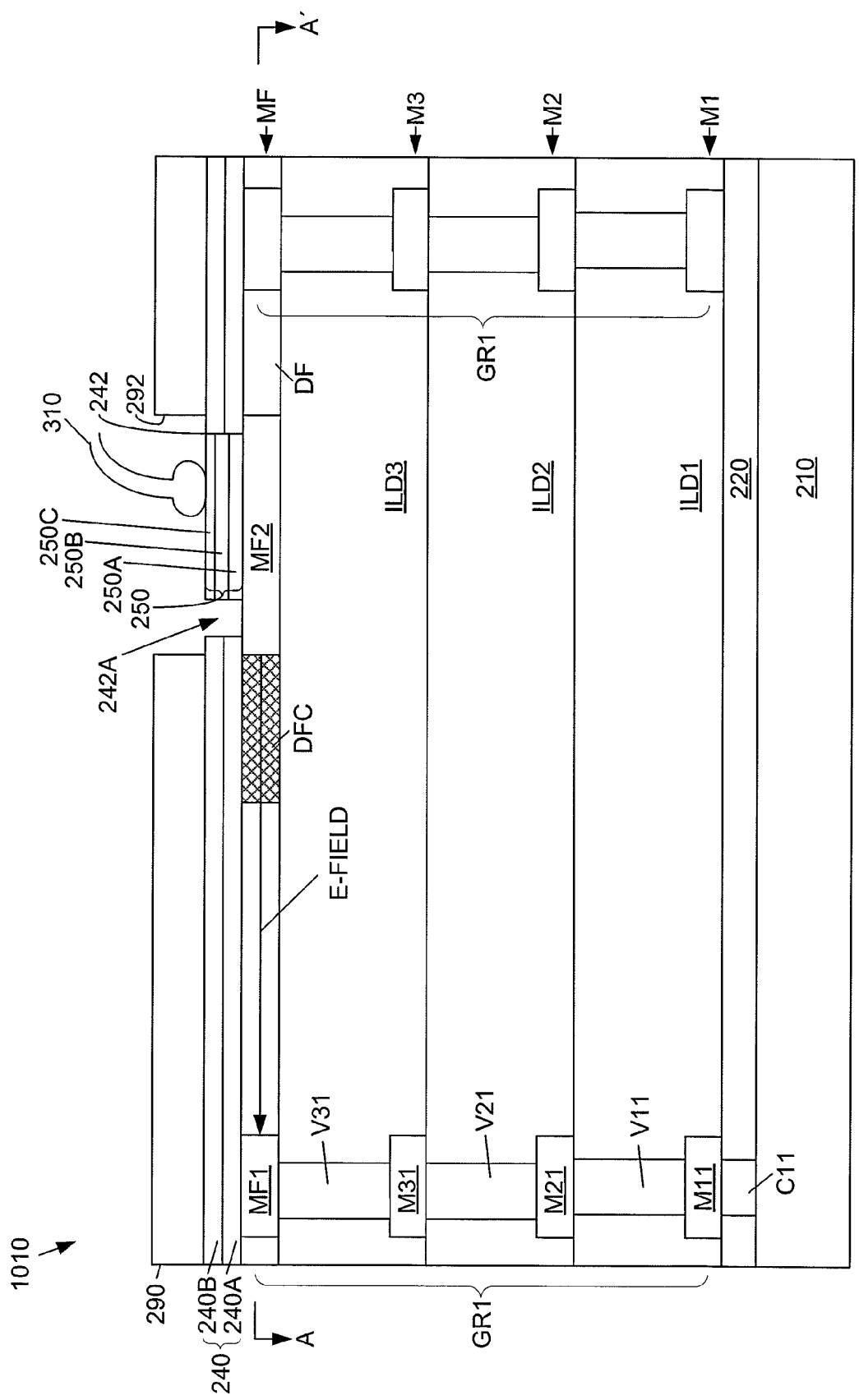
FIG. 1 shows a semiconductor structure in accordance with an embodiment.

FIG. 1 shows a semiconductor structure 1010. The semiconductor structure is an embodiment. The semiconductor structure 1010 may, for example, represent a portion of a semiconductor chip and/or a semiconductor device. The semiconductor structure 1010 includes a substrate 210. The substrate 210 may be any semiconductor substrate. The semiconductor substrate may be a silicon substrate. For example, the substrate may be a bulk semiconductor substrate or a silicon-on-insulator substrate. A bulk semiconductor substrate may include an epitaxial layer or may be made without an epitaxial layer.

The structure 1010 includes metallization levels M1, M2, M3 and MF. MF represents the final or top metallization level of the semiconductor structure. More generally, in other embodiments, the structure 1010 may include one or more metallization levels such as a plurality of metallization levels. The metallization levels may include a final or top metallization level MF.

Each of the metallization levels may include one or more conductive lines. For example, a metallization level may include a plurality of conductive lines. The conductive lines may be spacedly disposed from each other. In an embodiment, two or more conductive lines may be electrically isolated from each other. In one or more embodiments, two or more conductive lines may be electrically coupled together. In one or more embodiments, a conductive line may be useful for conductive electrical signals primarily in a horizontal direction. A conductive line may include or may be a conductive pad.

Referring to FIG. 1, it is seen that the structure 1010 includes a conductive line M11 which is part of the first metallization level M1, a conductive line M21 which part of the metallization level M2, a conductive line M31 which is part of the metallization level M3 and a first final conductive line MF1 which is part of the final metallization level MF. The conductive line M11 is embedded in an interlevel dielectric layer ILD1. The conductive line M21 is embedded in an interlevel dielectric layer ILD2. The conductive line M31 is embedded in an interlevel dielectric layer ILD3. The conductive line MF1 is embedded in a dielectric layer DF. In one or more embodiments, a conductive line may be a metallic line.

Conductive vias may also be part of the metallization system. In one or more embodiments, a conductive via may be useful for conducting electrical signals primarily in a vertical direction. For example, the structure 1010 shown in FIG. 1, includes conductive vias C11, V11, V21, and V31. The conductive via C11 electrically couples the conductive line M11 to the substrate 210. The conductive via V11 electrically couples the conductive line M11 to the conductive line M21. The conductive via V21 electrically couples the conductive line M21 to the conductive line M31. The conductive via V31 electrically couples the conductive line M31 to the conductive line MF1. A conductive via may include a metallic material.

In the embodiment shown, the conductive contact C11 is an example of a conductive via that electrically couples the first metallization level M1 to the substrate 210. The conductive contact C11 is embedded in a dielectric layer 220. A conductive contact may include a metallic material.

The structure 1010 includes interlevel dielectric layers ILD1, ILD2 and ILD3. The final metallization level MF is embedded in a dielectric layer DF.

The final metallization level MF may include one or more conductive lines. The final metallization level MF may include a plurality of spaced apart conductive lines. In one or more embodiments, the conductive lines may be electrically isolated from each other. A conductive line may, for example, transport current in a horizontal direction. A conductive line may be or may include a pad.

The structure 1010 may include a first guard ring GR1. The first guard ring GR1 may also be an outer guard ring. The first guard ring GR1 includes the conductive lines M11, M21, M31 and MF1. The first guard ring GR1 includes the conductive vias V11, V21 and V31. The first guard ring GR1 may be placed at a voltage VOLT1. The voltage VOLT1 may be the ground voltage. In the embodiment shown, the first guard ring GR1 is shown to be electrical coupled to the substrate by way of the conductive via (e.g. conductive contact) C11. However, in another embodiment, it need not be coupled to the substrate 210.

In an embodiment, the first guard ring GR1 may at least partially encircle the final conductive line MF2. In an embodiment, the first guard ring GR1 may fully encircle the final conductive line MF2. In an embodiment, the first guard ring GR1 may partially encircle the final conductive line MF2.

In an embodiment, the first guard ring GR1 may at least partially surround the final conductive line MF2. In an embodiment, the first guard ring GR1 may fully surround the final conductive line MF2. In an embodiment, the first guard ring GR1 may partially surround the final conductive line MF2.

FIG. 1 shows a final metallization level MF that includes a conductive line MF1 and a conductive line MF2. The conductive line MF2 may be a conductive pad (for example, a lower conductive pad) or may include a conductive pad. In the example shown in FIG. 1, the conductive line MF2 may serve as a lower conductive pad. An upper conductive pad 250 may be formed over the lower conductive pad MF2. A conductive lead 310 may be disposed over the upper conductive pad 310. The conductive lead 310 may provide electrical communication with the outside world.

A dielectric layer 240 may be disposed over the final metallization level MF. The dielectric layer 240 may for example, include a stack of two or more layers 240A and 240B (wherein layer 240A and layer 240B may be viewed as sublayer of layer 240). As an example, a dielectric layer 240 may include a first dielectric layer 240A and a second dielectric layer 240B overlying the first dielectric layer 240A. The first dielectric layer 240A may be an oxide layer such as a silicon oxide. The second dielectric layer 240B may be a nitride layer such as a silicon nitride.

A passivation layer 290 may be formed over the dielectric layer 240. The passivation layer 290 may, for example, include a polyimide.

An opening 292 may be formed through the passivation layer 290.

An opening 242 (for example, a pad opening) may be formed through the dielectric layer 240 so as to expose the conductive line MF2. An upper conductive pad 250 may then be formed within the opening 242 and over the conductive line MF2. The upper pad 250 may include at least one layer. In an embodiment, the upper pad 250 may include a stack of two or more layers such as a stack of three or more layers. In the embodiment shown, the upper pad 250 may include a stack of three layers 250A, 250B and 250C. The layer 250A may include NiP. The layer 250B may include the element Pd (palladium). The Pd may be in the form of pure palladium and/or palladium alloy. The layer 250C may include the element Au (gold). The Au may be in the form of pure gold and/or gold alloy.

It is possible that the upper pad 250 may not overlie all of the conductive line MF2. For example, the upper conductive pad 250 may not fill the lateral space of the opening 242. For example, it is possible that a space 242A (e.g. a portion of the opening 242) remains about at least a portion of the perimeter of the conductive line MF2 (e.g. between the outer perimeter of the upper pad 250 and the inner perimeter of the dielectric layer 240). In one or more embodiments, the space 242A may at least partially encircle (for example, laterally) the upper pad 250. In one or more embodiments, the space 242A may partially encircle the upper pad 250. In one or more embodiments, the space 242A may fully encircle the upper pad 250.

In one or more embodiments, the space 242A may at least partially surround (for example, laterally) the upper pad 250. In one or more embodiments, the space 242A may partially surround the upper pad 250. In one or more embodiments, the space 242A may fully surround the upper pad 250.

Contaminants (e.g. such as chemicals or moisture) may enter the structure through the space 242A where the dielectric layer 240 is broken. The contaminants may pass through the space 242A and diffuse along the interface between the final metallization level MF and the dielectric layer 240 deeper into the system. For example, the contaminants may diffuse along the interface between the dielectric layer 240 and final metal line MF2. Or the contaminants may move even deeper into the system by diffusing along the interface between the dielectric layer 240 and the dielectric layer DF.

The contaminants may, for example, degrade the electrical isolation properties of the dielectric layer DF within a region DFC (e.g. a contaminated region) of the dielectric layer DF. Hence, in one or more embodiments, the contaminated region DFC may have degraded or weakened dielectric properties. For example, it is possible that the resistivity of the material of the contaminated region DFC is less than the resistivity of the material of the non-contaminated portion of the layer DF.

In one or more embodiments, the conductive line MF2 may be placed at a voltage VOLT2 (perhaps by a lead 310). In an embodiment, the voltage VOLT2 may be different from the voltage VOLT1. In an embodiment, the voltage VOLT2 may be less than the voltage VOLT1. In an embodiment, the voltage VOLT2 may be greater than the voltage VOLT1. As noted the voltage VOLT1 may be the ground voltage. When the voltage VOLT2 is different from the voltage VOLT1, an electric field E-FIELD is created between the final conductive line MF2 and the first guard ring GR1. The electric field E-FIELD is shown to be a laterally directed electric field through the dielectric layer DF and, in particular, through the contaminated portion DFC of the dielectric layer DF. An electric field E-FIELD may be created because of the potential difference VOLT2-VOLT1. The electrical field E-FIELD may cause a current to flow within the degraded dielectric region DFC. In the embodiment shown in FIG. 1, the electric field E-FIELD points from the final conductive line MF2 to the guard ring GR1. In this case, the current flow would also be directed from the final conductive line MF2 to the guard ring GR1. However, in another embodiment, the electric field may point the other way from the guard ring GR1 to the final conductive line MF2.

Figure 2:
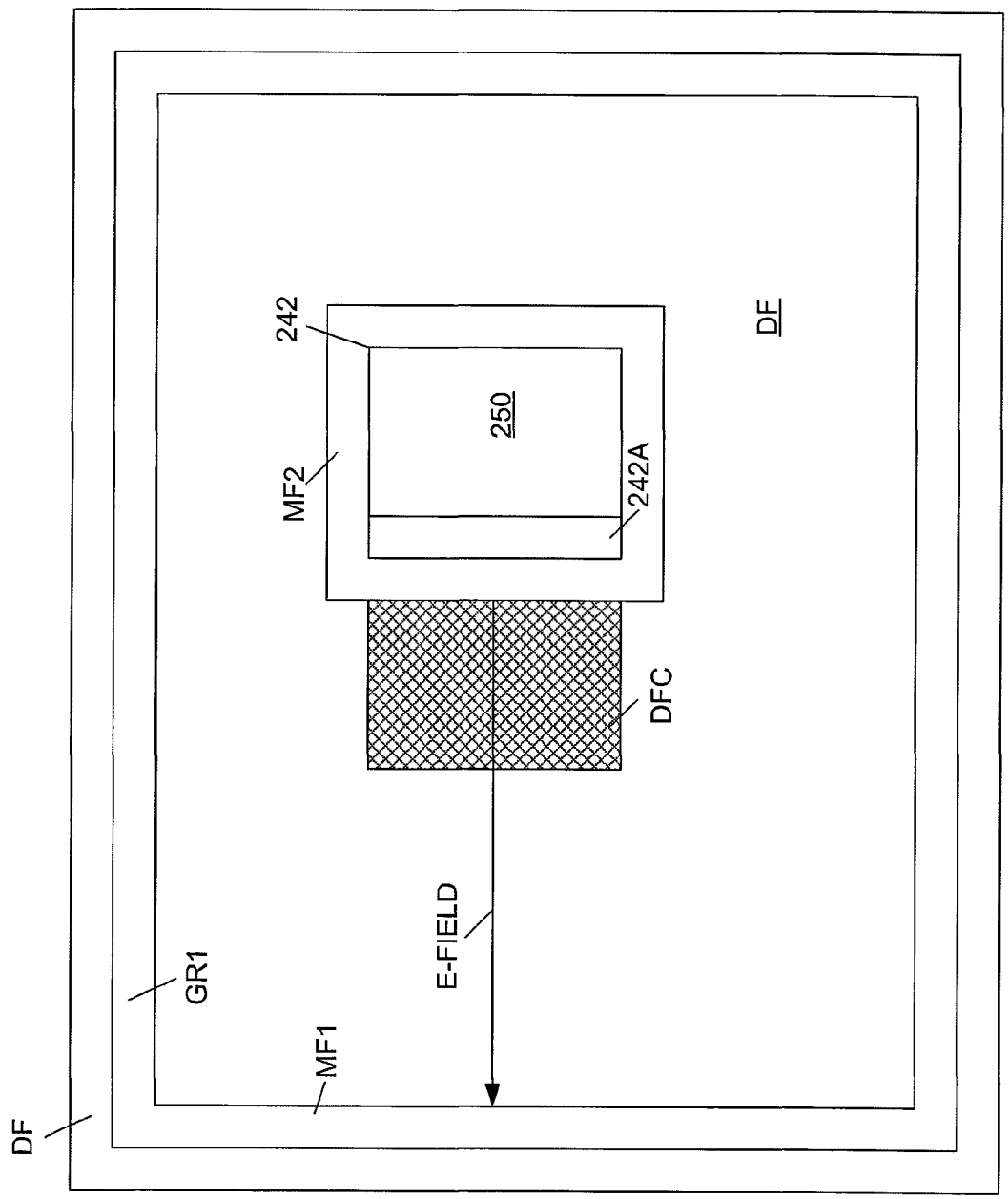
FIG. 2 shows a semiconductor structure in accordance with an embodiment.

FIG. 2 shows an embodiment of the invention. FIG. 2 shows an example of a lateral cross-sectional view through the cross-section AA' of the structure 1010 shown in FIG. 1. In the embodiment shown in FIG. 2, the first (e.g. outer) guard ring GR1 is shown to fully encircle the final conductive line MF2. In some embodiments, the first (e.g. outer) guard ring GR1 may at least partially (or may fully) surround the final conductive line MF2.

It is understood that the lateral cross-section of the first guard ring GR1 may have any shape such as rectangle, square, triangle, circle and oval. Hence, a ring is not limited to any particular shape. It is also understood that an encirclement by one object of another object may form any shape such as, for example, rectangle, square, triangle, circle and oval.

In an embodiment, the guard ring GR1 may follow the perimeter of the structure shown in FIG. 2. In one or more embodiments, the guard ring GR1 may be proximate the perimeter of the structure shown in FIG. 2. In an embodiment, the structure shown in FIG. 2 may be a semiconductor chip. It is noted that, in one or more embodiments, the first guard ring GR1 may only partially encircle the final conductive line MF2. Hence, the first guard ring GR1 may at least partially encircle the final conductive line MF2. The guard ring GR1 includes the final conductive line MF1 and may include other portions of the final metallization level (e.g. other final conductive lines). FIG. 2 also shows the contaminated portion DFC of the final dielectric layer DF. FIG. 2 shows the final conductive line MF2 as well as the upper conductive pad 250 which overlies the final metal line MF2. FIG. 2 shows the space 242A which is part of the opening 242. The space 242A permits contaminants to contaminate the dielectric layer DF so as to create the contaminated portion DFC of the dielectric layer DF. An electric field E-FIELD extends from the second final conductive line MF2 to the first final conductive line MF1. The electric field E-FIELD passes through the contaminated portion DFC of the dielectric layer DF.

Figure 3:
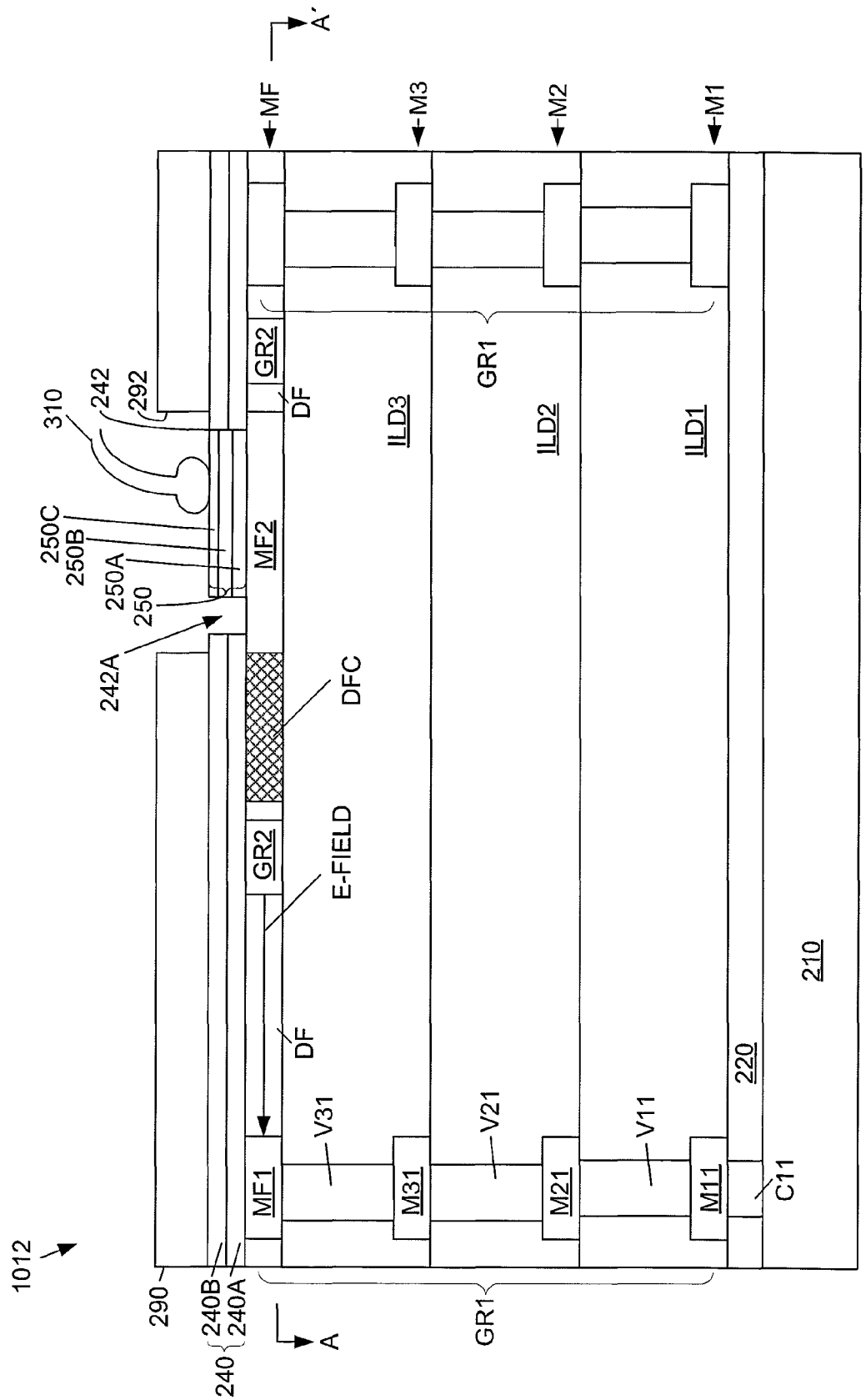
FIG. 3 shows a semiconductor structure in accordance with an embodiment.

FIG. 3 shows a semiconductor structure 1012 which is an embodiment of the present invention. In the embodiment shown in FIG. 3, a second guard ring GR2 is positioned as to at least partially encircle the conductive line MF2. In one or more embodiments, the second guard ring GR2 may fully encircle the conductive line MF2. In an embodiment, the second guard ring GR2 may only partially encircle the conductive line MF2. In an embodiment, the second guard ring GR2 may also be an inner guard ring.

It is understood that the lateral cross-section of the second guard ring GR2 may have any shape such as rectangle, square, triangle, circle and oval. The second guard ring GR2, is not limited to any particular shape. As noted above, an encirclement by one object of another object may have any shape such as, for example, rectangle, square, triangle, circle and oval.

In some embodiments, the second guard ring GR2 may at least partially surround the conductive line MF2. In one or more embodiments, the second guard ring GR2 may fully surround the conductive line MF2. In some embodiments, the second guard ring GR2 may only partially surround the conductive line MF2. In an embodiment, the second guard ring GR2 may also be an inner guard ring.

The second guard ring GR2 may be disposed between the first guard ring GR1 and the contaminated dielectric region DFC. In an embodiment, the second guard ring GR2 may at least partially encircle the contaminated region DFC. In an embodiment, the second guard ring GR2 may partially encircle the contaminated region DFC. In an embodiment, the second guard ring GR2 may fully encircle the contaminated region DFC. In an embodiment, the second guard ring GR2 may fully encircle both the final conductive line MF2 as well as the contaminated region GR2. In an embodiment, the second guard ring GR2 may fully encircle both the final conductive line MF2 as well as the contaminated region DFC. In an embodiment, the second guard ring GR2 may only partially encircle both the final conductive line MF2 as well as the contaminated region DFC. In an embodiment, the second guard ring GR2 may at least partially encircle both the final conductive line MF2 as well as the contaminated region DFC. The second guard ring GR2 may also be referred to as an inner guard ring while the first guard ring GR1 may be referred to as an outer guard ring.

In some embodiments, the second guard ring GR2 may at least partially surround the contaminated region DFC. In an embodiment, the second guard ring GR2 may partially surround the contaminated region DFC. In some embodiments, the second guard ring GR2 may fully surround the contaminated region DFC. In some embodiments, the second guard ring GR2 may fully surround both the final conductive line MF2 as well as the contaminated region DFC. In some embodiments, the second guard ring GR2 may fully surround both the final conductive line MF2 as well as the contaminated region DFC. In some embodiments, the second guard ring GR2 may only partially surround both the final conductive line MF2 as well as the contaminated region DFC. In some embodiments, the second guard ring GR2 may at least partially surround both the final conductive line MF2 as well as the contaminated region DFC.

In the embodiment shown, at least a portion of the second guard ring GR2 may be part of the final metallization level MF. In an embodiment, it is possible that the second guard ring GR2 may be part of one or more other metallization levels. Hence, in an embodiment, the second guard ring GR2 may include one or more conductive lines belonging to the final metallization level. In an embodiment, the second guard ring GR2 may include one or more conductive lines belonging to one or more of the other metallization levels. In an embodiment, the second guard ring GR2 may include one or more conductive vias.

The second guard ring GR2 may be electrically coupled to the conductive line MF2. Hence, it is possible that the voltage of the second guard ring GR2 is the same as the voltage of the conductive line MF2. Electrical coupling may be accomplished by other conductive lines and/or vias. The conductive lines that do the electrical coupling may be located on the same metallization level (for example, final metallization level) as the second guard ring GR2 and the conductive line MF2 or a different metallization level as the second guard ring GR2 and the conductive line MF2. As an example, electrical coupling may be accomplished by one or more other final conductive lines which are part of the final metallization level. As another example, electrical coupling may be accomplished by at least one conductive line that is part of another metallization level. Electrical coupling may also be accomplished by one or more conductive vias (and possibly in combination with one or more conductive lines). Electrical coupling may also be accomplished using a redistribution layer above the final metallization level.

The second guard ring GR2 may be positioned so that it is between the contaminated portion DFC of the dielectric layer DF and the first guard ring GR1.

By electrically coupling the second guard ring GR2 to the conductive line MF2, the second guard ring GR2 may be at the same voltage as the conductive line MF2. Hence, there may be no voltage difference and no lateral electrical field between the conductive line MF2 and the second guard ring GR2. Hence, there may be substantially no (or no) electric field. In an embodiment, there may be substantially no (or no) electric field within the contaminated region DFC. In particular, in an embodiment, there may be substantially no (or no) laterally directed electric field within the contaminated region DFC. In an embodiment, there may be substantially no (or no) electric field proximate the conductive line MF2. In an embodiment, there may be substantially no (or no) laterally directed electric field proximate the second conductive line MF2. Hence, there may be substantially no (or no) current flow within the contaminated region DFC. There may still be a voltage difference VOLT2-VOLT1 and a lateral electric field E-FIELD outside the contaminated region DFC. However, this may not be a problem since the dielectric strength of the non-contaminated portion of the dielectric layer DF may still be good in this region. Hence, while not wishing to be bound by theory, it is possible that the second guard ring GR2 may help to alleviate the problem caused by the space 242A and the contaminated portion DFC of the dielectric layer DF.

Figure 4:
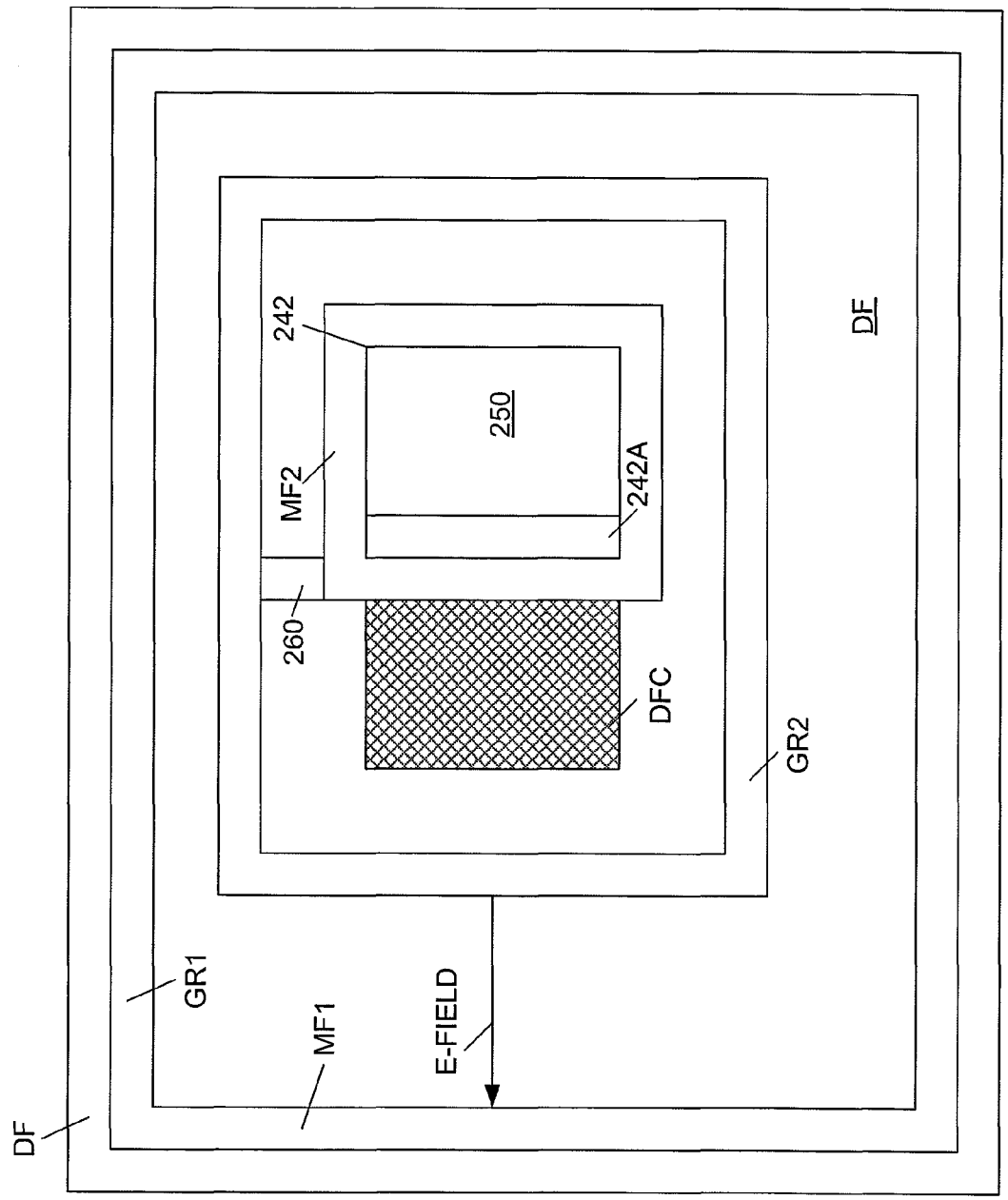
FIG. 4 shows a semiconductor structure in accordance with an embodiment.

FIG. 4 shows an example of a lateral cross-sectional view through the cross-section AA' of the structure 1012 from FIG. 3. In the embodiment shown in FIG. 4, the second guard ring GR2 is shown to fully encircle the final conductive line MF2 as well as the contaminated portion DFC. However, in other embodiments, the second guard ring GR2 may partially encircle the first guard ring GR1 and may partially encircle the contaminated region DFC. Hence, the second guard ring GR2 may at least partially encircle the first guard ring GR1 and may at least partially encircle the contaminated portion DFC. In an embodiment, the second guard ring GR2 may be positioned so that substantially no electric field or no electrical field (for example, substantially no lateral electric field or no lateral electric field) passes through the contaminated portion DFC. In one or more embodiments, the second guard ring GR2 may be position between the first guard ring GR1 and the conductive line MF2. In one or more embodiments, second guard ring GR2 may be positioned between the first guard ring GR1 and the contaminated portion DFC.

In some embodiments, the second guard ring GR2 may fully surround the final conductive line MF2 as well as the contaminated portion DFC. However, in other embodiments, the second guard ring GR2 may partially surround the first guard ring GR1 and may partially surround the contaminated region DFC. Hence, the second guard ring GR2 may at least partially surround the first guard ring GR1 and may at least partially surround the contaminated portion DFC. In an embodiment, the second guard ring GR2 may be positioned so that substantially no electric field or no electrical field (for example, substantially no lateral electric field or no lateral electric field) passes through the contaminated portion DFC. In one or more embodiments, the second guard ring GR2 may be position between the first guard ring GR1 and the conductive line MF2. In one or more embodiments, second guard ring GR2 may be positioned between the first guard ring GR1 and the contaminated portion GR1.

FIG. 4 shows that, in an embodiment, the electrical coupling between the second guard ring GR2 and the conductive line MF2 may be accomplished using the electrical coupling 260. The electrical coupling 260 may be part of the final metallization level (for example, it may be a final conductive line). However, the electrical coupling between the second guard ring GR2 and the final metal line MF2 may be accomplished in any way.

With the second guard ring GR2 in place, an electric field E-FIELD extends from the second guard ring GR2 to the first guard ring GR1 but there may be substantially no (or no) electric field through the contaminated portion DFC of the dielectric layer DF. In particular, there may be substantially no (or no) laterally directed electric field through the contaminated portion DFC of the dielectric layer DF.

Figure 5:
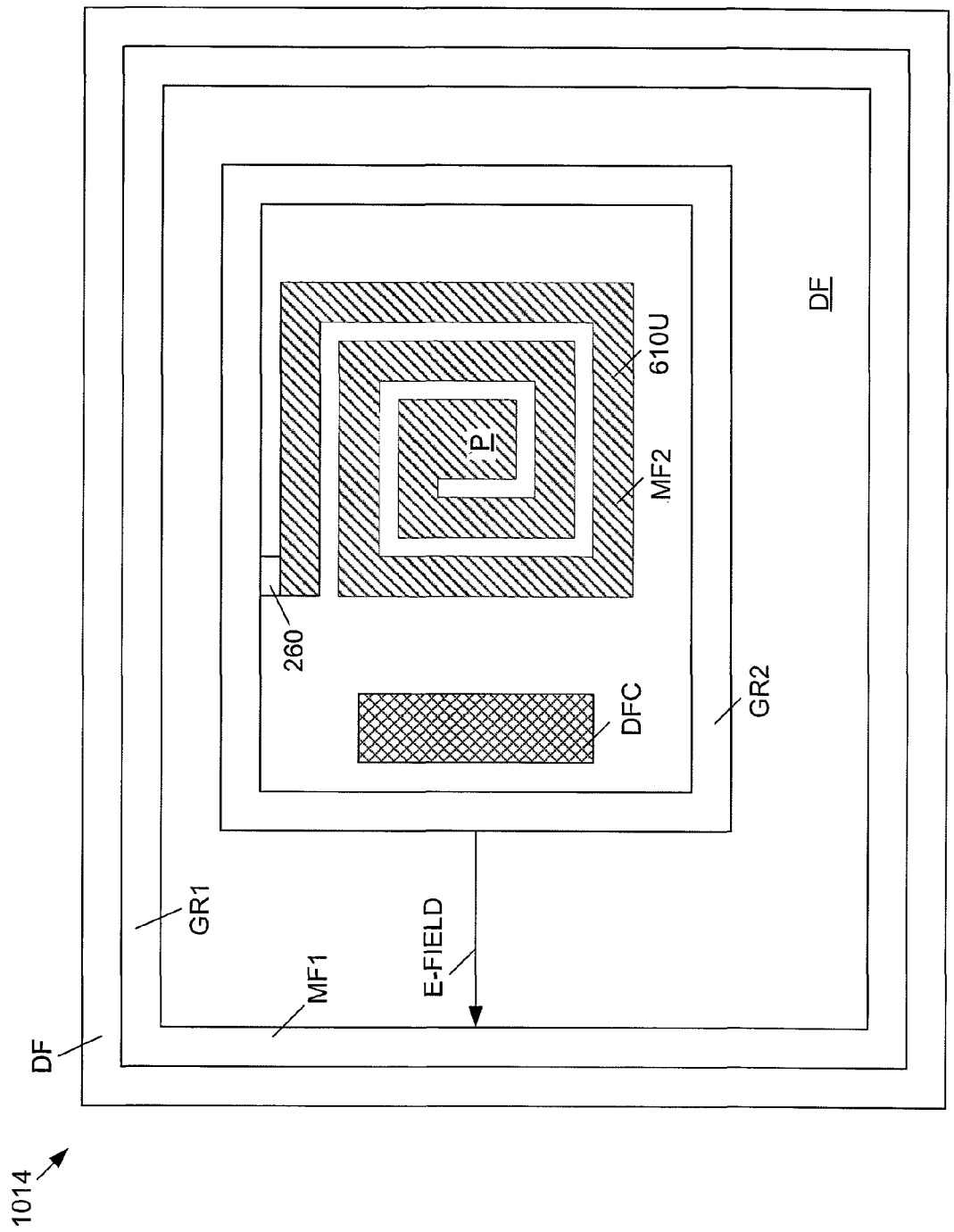
FIG. 5 shows a semiconductor structure in accordance with an embodiment.

The embodiments shown in FIGS. 1 through 4 show a final conductive line MF2. The final conductive line MF2 may have any shape. In one or more embodiments, the conductive line MF2 may be replaced with an conductive feature. In an embodiment, the final conductive line MF2 may be in the shape of a coil. FIG. 5 shows a structure 1014 which is a lateral cross-section of an embodiment wherein the final conductive line MF2 may be in the shape of a coil 610U. In the embodiment shown in FIG. 5, the coil 610U is a spiral coil. In other embodiments, the coil 61U may be replaced with a loop coil. The coil 610U may include a pad portion P.

Figure 6:
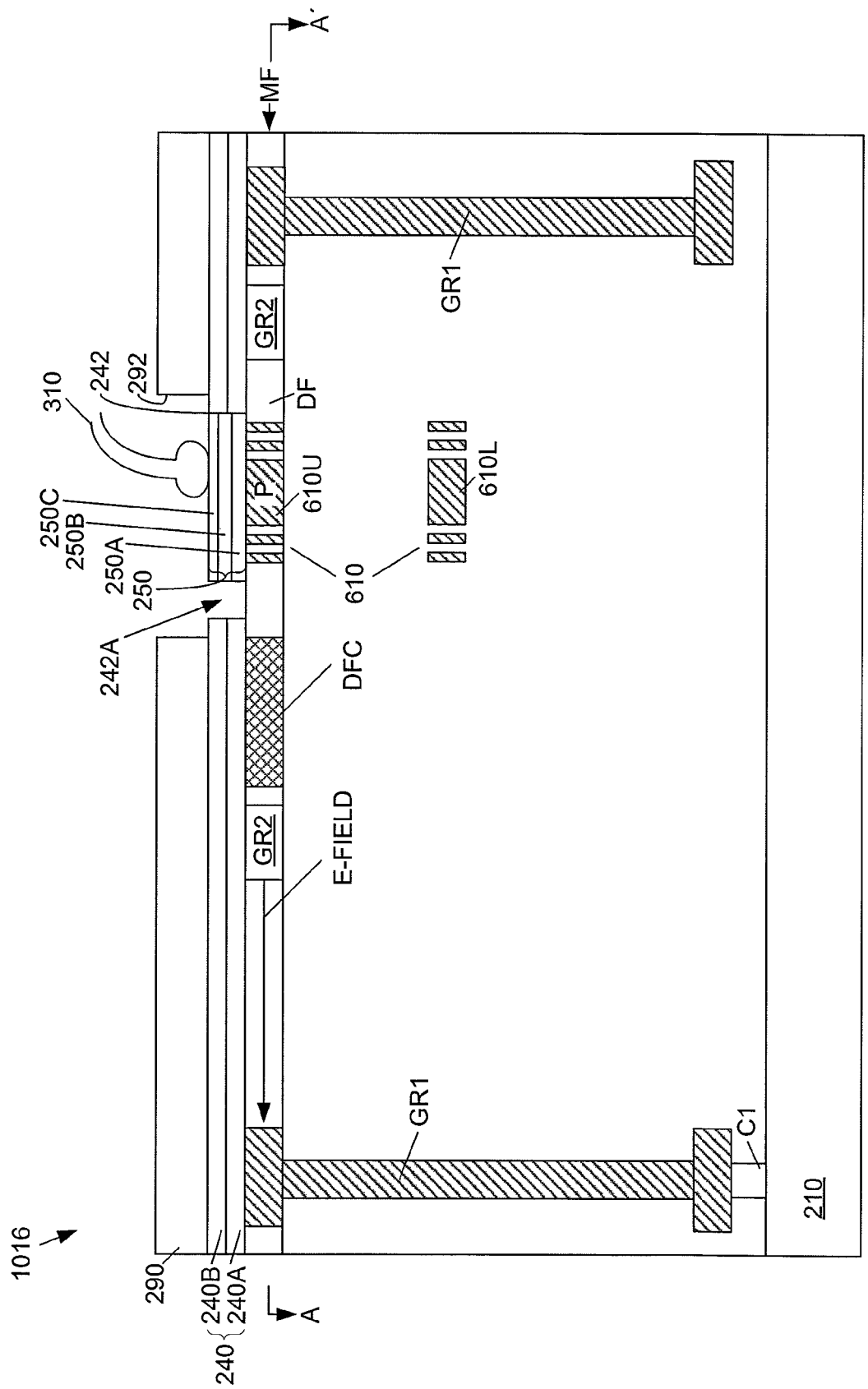
FIG. 6 shows a semiconductor structure in accordance with an embodiment.

The coil 610U may be one of the coils of a transformer, such as a coreless transformer. FIG. 6 shows a structure 1016. The structure 1016 shown in FIG. 6 may, for example, represent a vertical cross-section of the structure 1014 shown in FIG. 5. Likewise, the structure 1014 shown in FIG. 5 may, for example, represent a horizontal cross-section through the cross-section AA' shown in FIG. 6.

Referring to the structure 1016 shown in FIG. 6, it is seen that the coil 610U may be the upper coil of a transformer 610. The transformer 610 may also include a lower coil 610L. The transformer 610 may be a coreless transformer. In an embodiment, the upper coil may be at a higher voltage than the lower coil. In an embodiment, the lower coil may be at a higher voltage than the upper coil. The upper coil 610U may include a pad portion P that is used to electrically couple to a probe or to bond wire 310 that is shown in FIG. 6.

Referring to FIGS. 5 and 6, in some embodiments, the first guard ring GR1 may at least partially encircle the upper coil 610U. In some embodiments, the first guard ring GR1 may fully encircle the upper coil 610U. In some embodiments, the first guard ring GR1 may at least partially encircle the transformer 610. In some embodiments, the first guard ring GR1 may fully encircle the transformer 610.

In some embodiments, the second guard ring GR2 may fully encircle the upper coil 610U. In some embodiments, the second guard ring GR2 may at least partially encircle the transformer 610. In some embodiments, the second guard ring GR2 may fully encircle the transformer 610.

In some embodiments, the first guard ring GR1 may at least partially surround the upper coil 610U. In some embodiments, the first guard ring GR1 may fully surround the upper coil 610U. In some embodiments, the first guard ring GR1 may at least partially surround the transformer 610. In some embodiments, the first guard ring GR1 may fully surround the transformer 610.

In some embodiments, the second guard ring GR2 may fully surround the upper coil 610U. In some embodiments, the second guard ring GR2 may at least partially surround the transformer 610. In some embodiments, the second guard ring GR2 may fully surround the transformer 610.

Referring to FIG. 5, it is seen that the second guard ring GR2 may be electrically coupled to the upper coil 610U using an electrical coupling 260. The electrical coupling 260 may be part of the final metallization level. The electrical coupling 260 placing the second guard ring GR2 and the upper coil 610U at the same voltage.

Hence, the ideas presented herein are also applicable to coils as well as to transformers such as coreless transformers. Referring again to FIG. 5 and to FIG. 6, it is seen that a semiconductor structure may include a transformer 610 that includes an upper coil 610U and a lower coil 610L. In some embodiments, a first guard ring GR1 which may fully encircle the upper coil 610U. In another embodiment, the first guard ring GR1 may partially encircle the upper coil 610U. Hence, the first guard ring GR1 may at least partially encircle the upper coil 610U. In some embodiments, a second guard ring GR2 may fully encircle the upper coil 610U. In some embodiments, the second guard ring GR2 may partially encircle the upper coil 610U. Hence, the second guard ring GR2 may at least partially encircle the upper coil 610U.

Referring to FIGS. 5 and 6, in some embodiments, a first guard ring GR1 which may fully surround the upper coil 610U. In some embodiments, the first guard ring GR1 may surround the upper coil 610U. In some embodiments, the first guard ring GR1 may at least partially surround the upper coil 610U. In some embodiments, a second guard ring GR2 may fully surround the upper coil 610U. In some embodiments, the second guard ring GR2 may partially surround the upper coil 610U. In some embodiments, the second guard ring GR2 may at least partially surround the upper coil 610U.

The structure 1014 includes a final metallization level MF that is embedded in a dielectric layer DF. The dielectric layer DF includes a contaminated portion DFC.

Referring to FIGS. 5 and 6, the upper coil 610U may be part of the final metallization level MF. An upper bond pad 250 overlies the upper coil 610U. In particular, the upper bond pad 250 may overlie the pad portion P of the upper coil 610U.

It is noted that the second guard ring GR2 may help to improve the reliability of the transformer 610 that is shown in FIG. 6.

Any of the conductive lines and/or conductive layers and/or conductive vias and/or guard rings and/or conductive features (for example, coils and/or transformers) discussed herein may include any conductive material. The conductive material may, for example, include a metallic material. In one or more embodiment, a conductive material may include at least one element selected from the group consisting of Cu (copper), Al (aluminum), Au (gold), Ag (silver), and W (tungsten). A conductive material may include a pure metal and/or a metal alloy. It is understood that any pure metal may include trace impurities. In one or more embodiments, a conductive material may include at least one material selected from the group consisting of pure copper, copper alloy, pure aluminum, aluminum alloy, pure gold, gold alloy, pure silver, silver alloy, pure tungsten, and tungsten alloy.

Figure 7A:
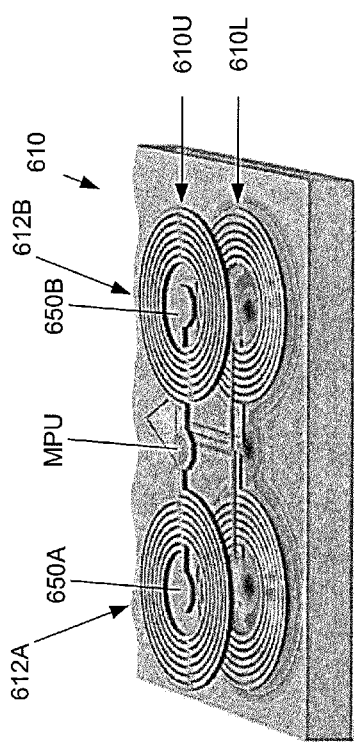
FIGS. 7A and 7B show a conductive feature in accordance with an embodiment.
Figure 7B:
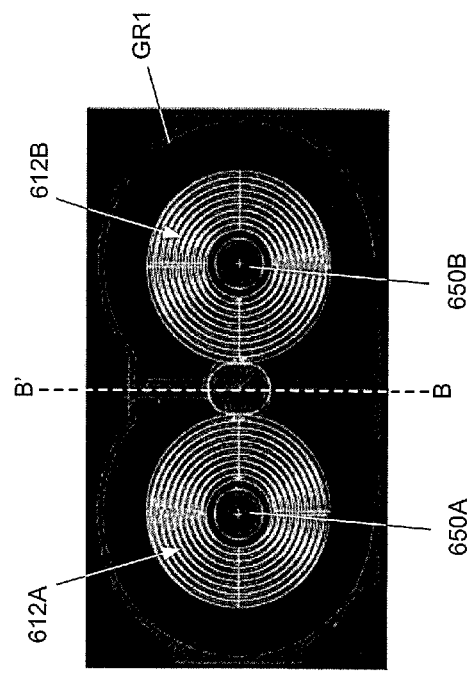

FIGS. 7A and 7B show a side perspective view and a top view respectively of a conductive feature according to various embodiments. The conductive feature may include a transformer 610, such as the transformer 610 described with respect to structure 1016. The transformer 610 may include upper coil 610U of the transformer 610. The transformer 610 may also include lower coil 610L of the transformer 610. From the top view as shown in FIG. 7B, upper coil 610U of the transformer 610 is shown. Upper coil 610U may include a first spiral coil 612A and a second spiral coil 612B. First spiral coil 612A and second spiral coil 612B may include one or more spirals or windings, such as a plurality of spirals or windings. A first end of first spiral coil 612A disposed at the center or eye of first spiral coil 612A may include a first electrically conductive pad 650A. A middle pad MPU may connect a second end of first spiral coil 612A to a second end of second spiral coil 612B. A first end of second spiral coil 612B disposed at the center or eye of second spiral coil 612B may include a second electrically conductive pad 650B. The middle pad MPU may be disposed between the first spiral coil 612A and the second spiral coil 612B.

Even though the middle pad MPU may be disposed between the first spiral coil 612A and the second spiral coil 612B, the middle pad MPU may not be enclosed by first spiral coil 612A and the second spiral coil 612B.

Figure 8:
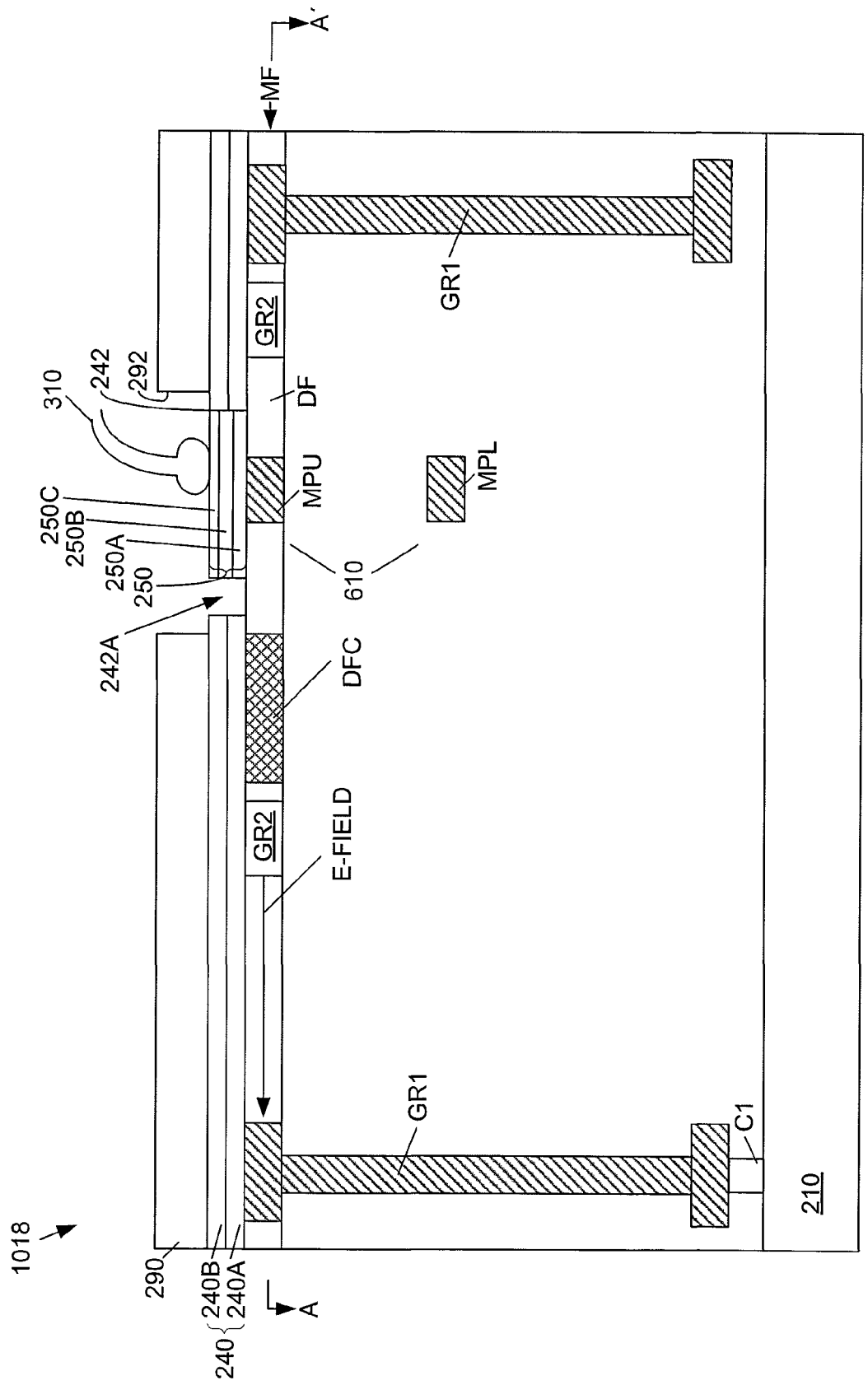
FIG. 8 shows a semiconductor structure in accordance with an embodiment.

The transformer 610 may be a part of a structure, such as structure 1018 described in FIG. 8. The upper coil 610U may form part of or be the final conductive line MF2 in an embodiment. The first guard ring GR1 may at least partially encircle the final conductive line MF2, i.e. the upper coil 610U in an embodiment. As an example, the first guard ring GR1 may at least partially encircle the conductive feature, such as at least one of the upper coil 610U and the lower coil 610L of transformer 610. In an embodiment, the first guard ring GR1 may fully encircle the final conductive line MF2. For example, as shown in FIG. 7B, the first guard ring GR1 may form a closed loop around upper coil 610U and/or the lower coil 610L. In an embodiment, instead of fully encircling the upper coil 610U, the first guard ring GR1 may only partially encircle the upper coil 610U and/or lower coil 610L.

FIG. 8 shows a structure 1018 according to an embodiment. The structure 1018 shown in FIG. 8 may include the conductive feature, such as transformer 610. FIG. 8 shows a horizontal cross-section BB' taken through the upper middle pad MPU of upper coil 610U, and through a lower middle pad MPL of the lower coil 610L.

The structure 1018 may also include the first guard ring GR1 which may at least partially surround upper coil 610U and lower coil 610L.

In some embodiments, lower coil 610L may be placed at chip potential, e.g. VOLT1, which may be a ground potential. Upper coil 610U may be placed at a high potential, e.g. VOLT2, which may be for example about 10 kV. First guard ring GR1 may be placed at VOLT1, in other words at the potential of lower coil 610L.

Without a second guard ring GR2, similar complexities as described according to FIG. 1 may occur. Due to a difference between voltage VOLT2 and voltage VOLT1, an electric field E-FIELD may be created. The electric field E-FIELD may be formed between the upper middle pad MPU of upper coil 610U, which may be placed at VOLT1, e.g. 10 kV, and the first guard ring GR1. For example, the electric field E-FIELD may be laterally directed through the dielectric layer DF and, in particular, through the contaminated portion DFC of the dielectric layer DF. In other words, the upper middle pad MPU of upper coil 610U sees the potential of the first guard ring GR1.

As shown in the structure 1018, a second guard ring GR2, may be included in the structure 1018. The second guard ring GR2 may partially encircle the middle pad MPU. Furthermore, the second guard ring GR2 may at least partially encircle the contaminated region DFC.

Figure 9C:
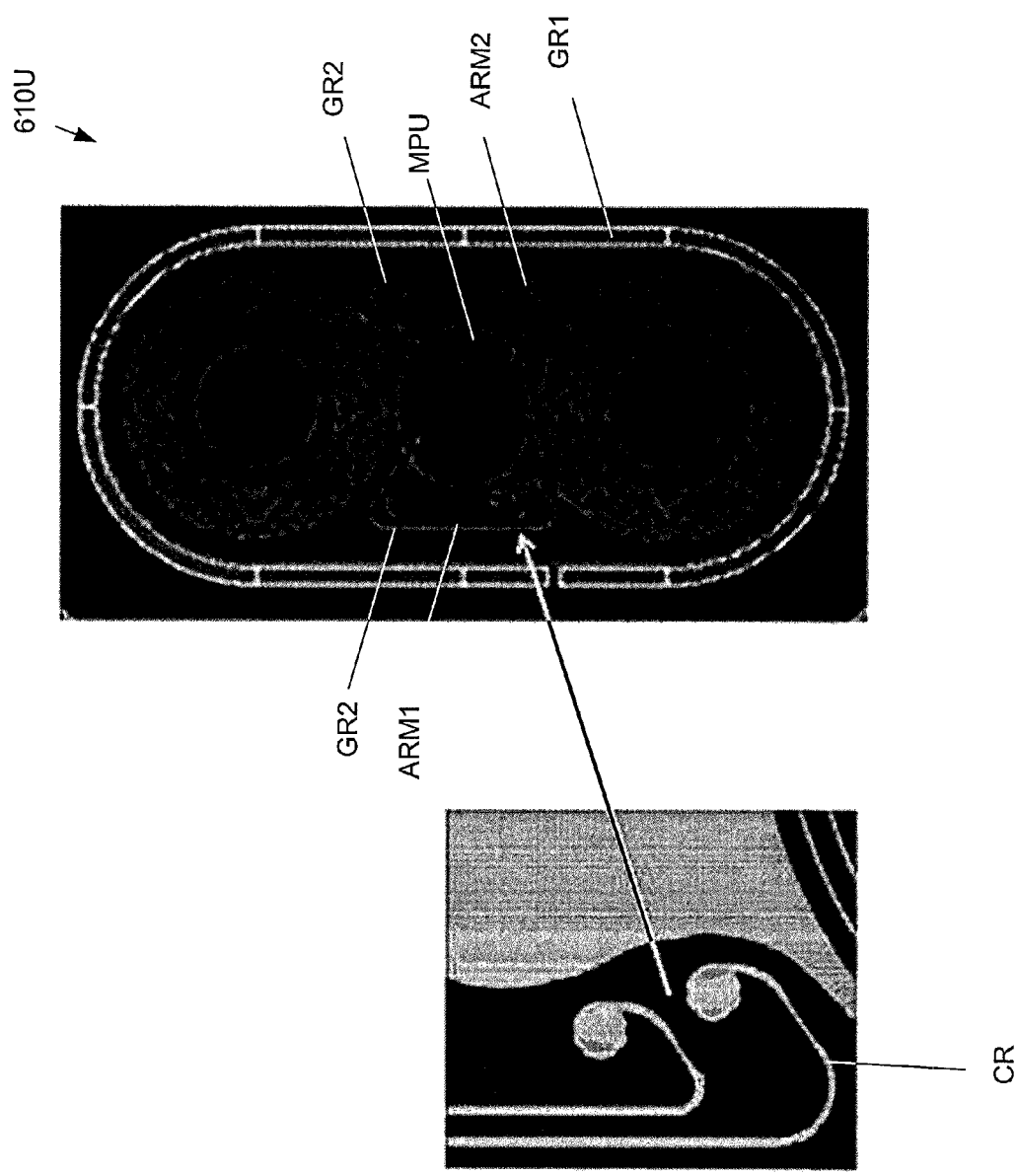

FIGS. 9A to 9C show various ways in which the second guard ring GR2 may be implemented in structure 1018.

In one embodiment, as shown in FIG. 9A, the second guard ring GR2 may partially encircle upper coil 610U. The second guard ring GR2 may be disposed between upper coil 610U and the first guard ring GR1. The second guard ring GR2 may be disposed between contaminated region DFC and the first guard ring GR1. The contaminated region DFC may be in the surrounding region, e.g. in the adjacent regions, of upper coil 610U. The contaminated region DFC may be in the surrounding region of middle pad MPU.

The second guard ring GR2 may also shield middle pad MPU from first guard ring GR1. For example, at least part of the second guard ring GR2 may be disposed between the middle pad MPU and the first guard ring GR1. The second guard ring GR2 may be in the form of an open loop ring which encircles upper coil 610U. The second guard ring GR2 may be structured in a shape which traces the outer perimeter of upper coil 610U. In other words, second guard ring GR2 may be disposed around the perimeter of upper coil 610U at a substantially uniform distance apart from the outermost coil or winding of upper coil 610U.

The second guard ring GR2 may be electrically coupled to the middle pad MPU, in other words, the second guard ring GR2 may be placed at the same voltage as middle pad MPU. This may mean that second guard ring GR2 may be electrically coupled to have the same voltage as middle pad MPU.

For example, the second guard ring GR2 may even be electrically coupled to the outermost coil or winding of the upper coil 610U. However, the second guard ring GR2 may be left open ended, i.e. not closed, to prevent induction of electrical current in the ring, which, in turn, may cause a magnetic field which may counteract the magnetic field of the upper coil 610U. The second guard ring GR2 may be buried in an insulation layer, e.g. dielectric layer DF, which may include an oxide or a nitride. The middle pad MPU may be exposed for bonding. The upper conductive pad 250 may be formed over the middle pad MPU.

FIG. 9A shows a structure of the second guard ring GR2 according to an embodiment. The second guard ring GR2 may have a first end electrically coupled or connected to the middle pad MPU. The second guard ring
GR2 may have a second end electrically isolated from the middle pad MPU, and distally separated from the first end of the middle pad MPU. The second guard ring GR2 may encircle or surround only part of the upper coil 610U, and at least part of the upper coil 610U may not be encircled by the second guard ring GR2.

FIG. 9B shows a structure of the second guard ring GR2 according to another embodiment, wherein the first end and the second end of the second guard ring GR2 may at least partially overlap. Despite overlapping, the first end and the second end are open. In other words, the first end and the second end do not form a closed ring.

FIG. 9C shows a structure of the second guard ring GR2 according to another embodiment. The second guard ring GR2 may include one or more sets of curved arms. As shown in FIG. 9C, the second guard ring GR2 may include two sets of curved arms, ARM1 and ARM2. Each set of curved arms ARM1 and ARM2 may include one or a plurality of curved arms. In an embodiment shown in FIG. 9C, each set of curved arms ARM1 and ARM2 may include two curved arms. It may be understood that each set of curved arms ARM1 and ARM2 may not be limited to two but may include only one curved arm or even more than two curved arms. The sets of curved arms ARM1 and ARM2 may be arranged to shield the middle pad MPU from the first guard ring GR1. As an example, one set of curved arms ARM1 may encircle a first part of an outer perimeter of middle pad MPU, and may be disposed between the first part and the first guard ring GR1. Another set of curved arms ARM2 may encircle a second part of an outer perimeter of middle pad MPU, and may be disposed between the second part and the first guard ring GR1. Each set of curved arms ARM1 and ARM2 may have a handlebar shape. Each set of curved arms ARM1 and ARM2 may have a first end electrically coupled to the middle pad MPU. Each set of curved arms ARM1 and ARM2 may have a second end which is not electrically coupled to the middle pad MPU, i.e. electrically isolated from middle pad MPU. The second ends of each set of curved arms ARM1 and ARM2 may be rounded. The rounded end portions CR of the curved arms ARM1 and ARM2 may avoid or reduce electric field peaks.

Figure 10:
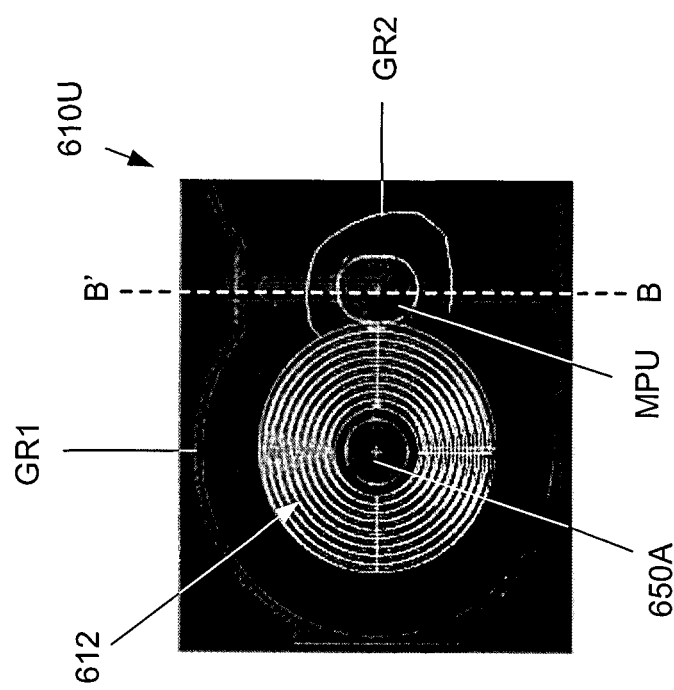
FIG. 10 shows a semiconductor structure in accordance with an embodiment.

FIG. 10 shows transformer 610 according to an embodiment. In an embodiment, transformer 610 may include the upper coil 610U and the lower coil 610L (not shown). However, each of the upper coil 610U and the lower coil 610L may only include a single spiral coil 612. FIG. 10 shows a top view of upper coil 610U having single spiral coil 612. First electrically conductive pad 650A may be disposed at the eye or center of single spiral coil 612. Middle pad MPU may be electrically coupled to the outermost coil or winding of upper coil 610U. A second guard ring GR2 may be electrically coupled at one end to a part of the structure which may be at the same potential as the middle pad MPU. As an example, the second guard ring GR2 may be electrically coupled to the outermost coil or winding of upper coil 610U and/or to the middle pad MPU. The second guard ring GR2 may encircle the middle pad MPU, however may remain open-ended. In other words, the second guard ring GR2 may not form a closed electrical loop.

One or more embodiments relate to a semiconductor structure, including: a conductive feature; an outer guard ring; and an inner guard ring between the outer guard ring and the conductive feature, the inner guard ring being at the same voltage as the conductive feature.

According to one or more embodiments, the outer guard ring at least partially encircles the conductive feature.

According to one or more embodiments, the inner guard ring at least partially encircles the conductive feature.

According to one or more embodiments, the inner guard ring partially encircles the conductive feature.

According to one or more embodiments, the inner guard ring fully encircles the conductive feature.

According to one or more embodiments, the conductive feature is part of a final metallization level.

According to one or more embodiments, the conductive feature is a conductive coil.

According to one or more embodiments, the conductive feature is a transformer, the transformer including an upper coil over a lower coil.

According to one or more embodiments, the inner guard ring is part of a final metallization level.

According to one or more embodiments, the said outer guard ring is proximate the periphery of the semiconductor structure.

According to one or more embodiments, the conductive feature is embedded in a dielectric layer, the dielectric layer including a contaminated portion between the outer guard ring and the conductive feature.

According to one or more embodiments, the inner guard ring is positioned so that there is substantially no lateral electric field through the contaminated portion.

According to one or more embodiments, the inner guard ring is between said outer guard ring and the contaminated portion.

According to one or more embodiments, a resistivity of the contaminated portion is less than a resistivity of a non-contaminated portion of the dielectric layer.

According to one or more embodiments, the conductive feature is a capacitor.

According to one or more embodiments, the conductive feature is a capacitor, the capacitor including an upper capacitor plate over a lower capacitor plate.

One or more embodiments relate to a semiconductor structure, including: a conductive feature; an outer guard ring; and an inner guard ring between the outer guard ring and the conductive feature, the inner guard ring being electrically coupled to the conductive feature.

According to one or more embodiments, the outer guard ring at least partially encircles the conductive feature.

According to one or more embodiments, the inner guard ring at least partially encircles the conductive feature.

According to one or more embodiments, the conductive feature is part of a final metallization level.

According to one or more embodiments, the conductive feature is a conductive coil.

According to one or more embodiments, the conductive feature is a transformer, the transformer including an upper coil over a lower coil.

According to one or more embodiments, the inner guard ring is part of a final metallization level.

According to one or more embodiments, the outer guard ring is proximate the periphery of the semiconductor structure.

According to one or more embodiments, the conductive feature is embedded in a dielectric layer, the dielectric layer including a contaminated portion between the outer guard ring and the conductive feature.

According to one or more embodiments, the inner guard ring is positioned so that there is substantially no lateral electric field in the contaminated portion.

According to one or more embodiments, the inner guard ring is positioned so that there is substantially no current in the contaminated portion.

According to one or more embodiments, the inner guard ring is between the outer guard ring and the contaminated portion.

According to one or more embodiments, a resistivity of the contaminated portion is less than a resistivity of a non-contaminated portion.

According to one or more embodiments, the conductive feature is a capacitor.

According to one or more embodiments, the conductive feature is a capacitor, the capacitor including an upper capacitor plate over a lower capacitor plate.

One or more embodiments relate to a semiconductor structure, including: a dielectric layer the dielectric layer having a contaminated portion; a conductive feature disposed in the dielectric layer, the conductive feature being at a first voltage; and an outer guard ring disposed in the dielectric layer, the outer guard ring being at a second voltage different from the first voltage, wherein there is substantially no lateral electric field proximate the conductive feature.

One or more embodiments relate to a semiconductor structure, including: a dielectric layer the dielectric layer having a contaminated portion; a conductive feature disposed in the dielectric layer, the conductive feature being at a first voltage; and an outer guard ring disposed in the dielectric layer, the outer guard ring being at a second voltage different from the first voltage, wherein there is substantially no lateral electric field within the contaminated portion.

According to one or more embodiments, the semiconductor structure further includes an inner guard ring between said outer guard ring and said contaminated portion.

According to one or more embodiments, outer guard ring at least partially encircles the conductive feature. According to one or more embodiments, the inner guard ring at least partially encircles the conductive feature.

According to one or more embodiments, the conductive feature is part of a final metallization level.

According to one or more embodiments, the conductive feature is a conductive coil.

According to one or more embodiments, the conductive feature is a transformer, the transformer including an upper coil over a lower coil.

According to one or more embodiments, the inner guard ring is part of a final metallization level.

According to one or more embodiments, the contaminated portion has a resistivity less than a remaining portion of said dielectric layer.

According to one or more embodiments, the conductive feature is a capacitor.

According to one or more embodiments, the conductive feature is a capacitor, the capacitor including an upper capacitor plate over a lower capacitor plate.

One or more embodiments relate to a semiconductor structure, including: a conductive feature; an outer guard ring; and an inner guard ring between said outer guard ring and the conductive feature, said outer guard ring being at the same voltage as the conductive feature.

One or more embodiments relate to a semiconductor structure, including: a conductive feature; an outer guard ring; and an inner guard ring between the outer guard ring and said conductive feature, said inner guard ring being electrically coupled to the conductive feature.

One or more embodiments relate to a semiconductor structure, including: a dielectric layer the dielectric layer having a corrupted portion; a conductive feature disposed in said dielectric layer, the conductive feature being at a first voltage; and an outer guard ring disposed in said dielectric layer, the outer guard ring being at a second voltage different from said first voltage, wherein there is substantially no lateral electric field within the corrupted portion.

One or more embodiments relate to a semiconductor structure, including: a dielectric layer the dielectric layer having a corrupted portion; a conductive feature disposed in the dielectric layer, the conductive feature being at a first voltage; and an outer guard ring disposed in the dielectric layer, the outer guard ring being at a second voltage different from said first voltage, wherein there is substantially no lateral electric field proximate the conductive feature.

The disclosure herein is presented in the form of detailed embodiments described for the purpose of making a full and complete disclosure of the present invention, and that such details are not to be interpreted as limiting the true scope of this invention as set forth and defined in the appended claims.

What is claimed is:

1. A semiconductor structure, comprising:
   a conductive feature;
   an outer guard ring; and
   an inner guard ring between said outer guard ring and said conductive feature, said inner guard ring being at the same voltage as said conductive feature,
   wherein said inner guard ring is part of a final metallization level; and
   wherein said conductive feature is embedded in a dielectric layer, said dielectric layer including a contaminated portion between said outer guard ring and said conductive feature.

2. The structure of claim 1, wherein said outer guard ring at least partially encircles said conductive feature.

3. The structure of claim 1, wherein said inner guard ring at least partially encircles said conductive feature.

4. The structure of claim 1, wherein said conductive feature is part of a final metallization level.

5. The structure of claim 1, wherein said conductive feature is a conductive coil.

6. The structure of claim 1, wherein said conductive feature is a transformer, said transformer including an upper coil over a lower coil.

7. The semiconductor structure of claim 1, wherein said outer guard ring is proximate the periphery of said semiconductor structure.

8. The structure of claim 1, wherein said inner guard ring is positioned so that there is substantially no lateral electric field through said contaminated portion.

9. The structure of claim 1, wherein said inner guard ring is between said outer guard ring and said contaminated portion.

10. The structure of claim 1, wherein a resistivity of said contaminated portion is less than a resistivity of a non-contaminated portion of said dielectric layer.

11. The structure of claim 1, wherein said conductive feature is a capacitor.

12. The structure of claim 1, wherein said conductive feature is a capacitor, said capacitor including an upper capacitor plate over a lower capacitor plate.

13. A semiconductor structure, comprising:
a conductive feature;
an outer guard ring; and
an inner guard ring between said outer guard ring and said conductive feature, said inner guard ring being electrically coupled to said conductive feature, wherein said inner guard ring is part of a final metallization level, and
wherein said conductive feature is embedded in a dielectric layer, said dielectric layer including a contaminated portion between said outer guard ring and said conductive feature.

14. The structure of claim 13, wherein said outer guard ring at least partially encircles said conductive feature.

15. The structure of claim 13, wherein said inner guard ring at least partially encircles said conductive feature.

16. The structure of claim 13, wherein said conductive feature is part of a final metallization level.

17. The structure of claim 13, wherein said conductive feature is a conductive coil.

18. The structure of claim 13, wherein said conductive feature is a transformer, said transformer including an upper coil over a lower coil.

19. The semiconductor structure of claim 13, wherein said outer guard ring is proximate the periphery of said semiconductor structure.

20. The structure of claim 13, wherein said inner guard ring is positioned so that there is substantially no lateral electric field in said contaminated portion.

21. The structure of claim 13, wherein said inner guard ring is positioned so that there is substantially no current in said contaminated portion.

22. The structure of claim 13, wherein said inner guard ring is between said outer guard ring and said contaminated portion.

23. The structure of claim 13, wherein a resistivity of said contaminated portion is less than a resistivity of a non-contaminated portion.

24. The structure of claim 13, wherein said conductive feature is a capacitor.

25. The structure of claim 13, wherein said conductive feature is a capacitor, said capacitor including an upper capacitor plate over a lower capacitor plate.

26. A semiconductor structure, comprising:
a dielectric layer, said dielectric layer having a contaminated portion;
a conductive feature disposed in said dielectric layer, said conductive feature being at a first voltage;
an outer guard ring disposed in said dielectric layer, said outer guard ring being at a second voltage different from said first voltage; and
an inner guard ring between said outer guard ring and said contaminated portion,
wherein there is substantially no lateral electric field within said contaminated portion.

27. The structure of claim 26, wherein said outer guard ring at least partially encircles said conductive feature.

28. The structure of claim 26, wherein said inner guard ring at least partially encircles said conductive feature.

29. The structure of claim 26, wherein said conductive feature is part of a final metallization level.

30. The structure of claim 26, wherein said conductive feature is a conductive coil.

31. The structure of claim 26, wherein said conductive feature is a transformer, said transformer including an upper coil over a lower coil.

32. The structure of claim 26, wherein said inner guard ring is part of a final metallization level.

33. The structure of claim 26, wherein said contaminated portion has a resistivity less than a remaining portion of said dielectric layer.

34. A semiconductor structure, comprising:
a dielectric layer, said dielectric layer having a contaminated portion;
a conductive feature disposed in said dielectric layer, said conductive feature being at a first voltage;
an outer guard ring disposed in said dielectric layer, said outer guard ring being at a second voltage different from said first voltage; and
an inner guard ring between said outer guard ring and said contaminated portion,
wherein there is substantially no lateral electric field proximate said conductive feature.

35. The structure of claim 26, wherein said conductive feature is a capacitor.

36. The structure of claim 26, wherein said conductive feature is a capacitor, said capacitor including an upper capacitor plate over a lower capacitor plate.

* * * * *